United States Patent [19]

Beckett

[11] Patent Number: 4,835,859
[45] Date of Patent: Jun. 6, 1989

[54] METHOD OF FORMING A CONTACT BUMP

[75] Inventor: Frederick J. Beckett, Portland, Oreg.

[73] Assignee: Tektronix, Inc., Beaverton, Oreg.

[21] Appl. No.: 128,366

[22] Filed: Dec. 3, 1987

[51] Int. Cl.$^4$ .............................................. H05K 3/00
[52] U.S. Cl. ...................... 29/846; 174/68.5; 361/406
[58] Field of Search ................. 29/825, 846, 832, 834, 29/836; 174/68.5; 361/406, 417, 418, 419; 357/69

[56] References Cited

U.S. PATENT DOCUMENTS

| | | | |
|---|---|---|---|
| 3,374,400 | 3/1968 | Tabuchi et al. | 361/406 |
| 4,000,054 | 12/1976 | Marcantonio | 174/68.5 X |
| 4,420,767 | 12/1983 | Hodge et al. | 357/69 X |
| 4,421,944 | 12/1983 | Desmarais, Jr. | 174/68.5 |

OTHER PUBLICATIONS

IBM Tech. Discl. Bull., vol. 5, No. 6, Nov. 1962, pp. 37–38 by Kaweck et al.
IBM Tech. Discl. Bull., vol. 7, No. 6, Nov. 1964, pp. 469–470 by Feth.
IBM Tech. Discl. Bull., vol. 11, No. 8, Jan. 1969, p. 962 by Hermann.
IBM Tech. Discl. Bull., vol. 18, No. 9, Feb. 1976, p. 2817 by Ward.

*Primary Examiner*—Carl J. Arbes
*Attorney, Agent, or Firm*—John Smith-Hill; Peter J. Meza

[57] ABSTRACT

A contact bump is formed on a sheet of electrically-conductive material by plastically deforming the sheet so as to form a depression at one side of the sheet and a corresponding bump at the opposite side of the sheet. Solid material is placed in the depression, and the sheet of electrically-conductive material is secured at its one side to a support member.

4 Claims, 2 Drawing Sheets

U.S. Patent    Jun. 6, 1989    Sheet 1 of 2    4,835,859
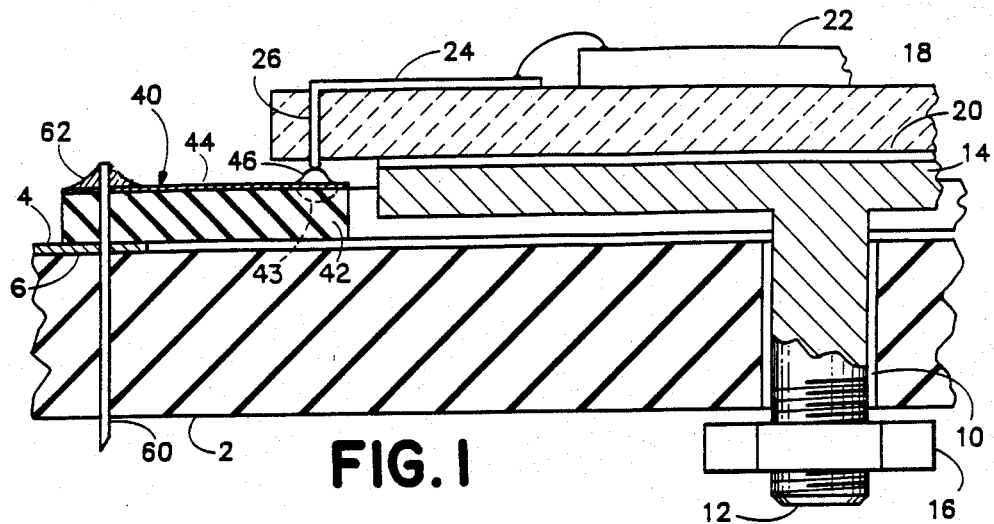
FIG. 1
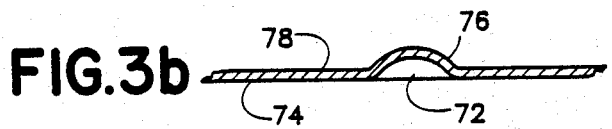
FIG. 3a
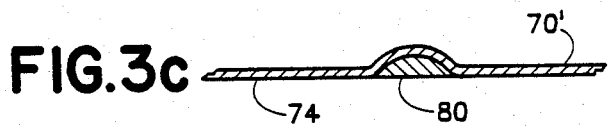
FIG. 3b
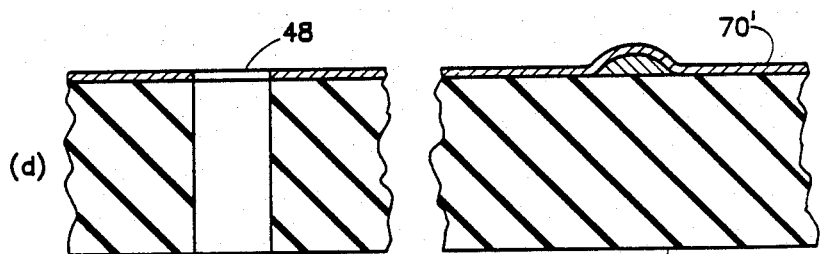
FIG. 3c
FIG. 3d
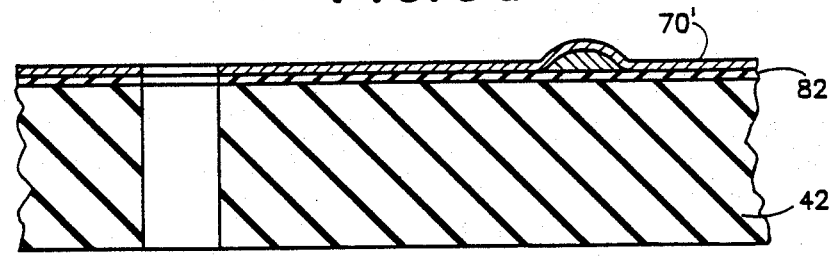
FIG. 4

4,835,859

METHOD OF FORMING A CONTACT BUMP

BACKGROUND OF THE INVENTION

This invention relates to a method of forming a contact bump.

In order to provide a good, electrically-conductive connection between, for example, a contact pad of a circuit board and a contact pad of a hybrid circuit, it is conventional to form a bump on one of the contact pads. The effect of the bump is to increase the contact pressure for a given contact force and thereby reduce the contact resistance between the pad of the hybrid circuit and the pad of the circuit board.

It is conventional to form a bump on a pad of a circuit board by plating metal onto the contact pad. Generally, gold is selected as the metal for the bump because it does not corrode and therefore its contact resistance does not change with time. However, a relatively large volume of gold is required in order to provide a given contact area, and therefore use of plated-up gold contact bumps is expensive. Moreover, it is very difficult to control the plating process in order to obtain bumps of a desired, e.g. part-spherical, shape.

SUMMARY OF THE INVENTION

In a preferred embodiment of the present invention, a contact bump is formed on a sheet of electrically-conductive material by plastically deforming the sheet so as to form a depression at one side of the sheet and a corresponding bump at the opposite side of the sheet. Solid material is placed in the depression, and the sheet of electrically-conductive material is secured at its one side to a support member.

BRIEF DESCRIPTION OF THE DRAWINGS

For a better understanding of the invention, and to show how the same may be carried into effect, reference will now be made, by way of example, to the accompanying drawings in which:

FIG. 1 is a partial sectional view illustrating an interconnect device for connecting a conductor run of a circuit board to a conductor run of a hybrid circuit, FIGS. 3a-3d are a series of sectional views illustrating various steps in manufacture of the FIG. 1 interconnect device, FIG. 4 is a sectional view of a second interconnect device.

DETAILED DESCRIPTION

Figure 2:
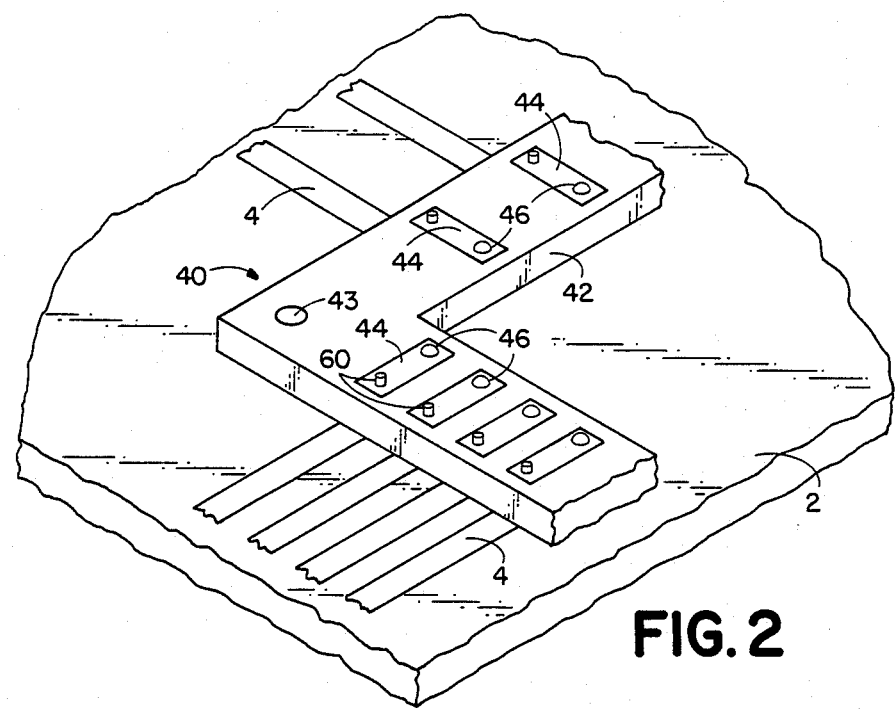
FIG. 2 is a perspective view taken from above the FIG. 1 interconnect device with the hybrid circuit removed.

FIG. 1 illustrates a circuit board 2 having conductor runs 4 which terminate in connection pads 6. The circuit board is formed with a hole 10 which receives a threaded stud 12. The upper end of the stud is secured to a heat sink plate 14, and the lower end of the stud is provided with a nut 16. A ceramic substrate 18 is secured to the heat sink plate 14 by a layer 20 of thermally-conductive adhesive. An integrated circuit die 22 is mounted on the upper surface of the substrate 18, and connection pads of the die are connected to conductor runs 24 formed on the upper surface of the substrate by wire bonding. The substrate projects at its periphery beyond the periphery of the heat sink plate 14, and the conductor runs 24 extend over the region of the substrate that projects beyond the heat sink plate. In this region, the substrate is formed with conductive vias 26 which are electrically connected to the conductor runs 24 and are exposed at the lower surface of the substrate.

An interconnect device 40 is used to provide electrical connection between the connection pads 6 of the circuit board and the vias 26. The interconnect assembly comprises a body 42 of elastomer material. The body 42 may be formed with alignment holes 43, of which one is shown in FIG. 2, for receiving alignment posts carried by the substrate 18 and/or by the circuit board 2. The body 42 has conductive strips 44 on its upper surface. At one end, each strip is formed with a bump 46, and at the other end it is formed with a hole 48. Corresponding holes are formed in the body 42 and the circuit board 2. The holes in the circuit board pass through the connection pads 6 respectively. Metal pins 60 are inserted through the holes 48 in the strips 44 and through the corresponding holes in the body 42 and the circuit board 2. The pins fit tightly in the holes in the circuit board and therefore remain in position without need for bonding to the circuit board. The upper ends of the pins are physically and electrically connected to the strips 44 by solder 62. In this fashion, good electrically-conductive connection is provided between the conductor runs 4 of the circuit board 2 and the strips 44. By tightening the nut 16 to an appropriate degree, the exposed ends of the vias 26 are brought into firm pressure contact with the bumps 46, and compression of the body 42 in the region 43 beneath the bumps provides contact force between the bumps and the exposed ends of the vias. If the nut 16 is tightened to an excessive degree, the exposed ends of the vias 26 are brought too close to the circuit board 2. Unless compressible material is used for the body 42, this would result in deformation of the bumps 46 and/or damage to the substrate 18. Thus, use of resiliently compressible material for the body 42 not only results in a good electrically-conductive connection being provided between the strips 44 and the conductor runs 24 but also protects the bumps 48 against possible deformation.

The interconnect device 40 is fabricated from a flat sheet 70 (FIG. 3(a)) of metal, such as copper, using a pressing tool (not shown). The tool comprises a punch and a die. The die is formed with recesses of which the size and shape correspond to the desired external size and shape of the bumps 46, and the recesses are distributed in accordance with the desired pattern of the bumps 46. The punch is formed with projections which enter the recesses respectively when the tool is actuated. The sheet 70 is placed in the tool. The tool is actuated, and the projections engage the metal sheet and at the location of each projection and corresponding recess a depression 72 of controlled depth and shape is formed at one side 74 of the sheet and a corresponding protrusion 76 is formed at the opposite side of the sheet (FIG. 3(b)). The depression is filled with a material 80 which adheres to the metal and is substantially non-yielding (FIG. 3(c)). Suitable fill materials are solder and epoxy. Upon filling the depressions, the side 74 of the metal sheet is rendered substantially flat once more. The thus-treated sheet 70' is then placed in an injection molding die which defines a cavity bounded by the side 74. The die cavity is configured in the desired shape of the elastomer body 42, and the die includes posts in the desired positions of the alignment holes 43 and the pins 60. Elastomer material in uncured form is introduced into the die cavity and is cured. The elastomer material bonds firmly to the side 74 of the metal sheet and to the fill material 80. The sheet 70' having the body 42 of elastomer material bonded thereto (FIG. 3(d)) is removed from the die. The copper sheet is then selectively etched using conventional photoprocessing techniques to remove portions of the sheet other than the strips 44. The holes 48 are formed in the selective etching step. The interconnect device is then complete.

When the interconnect device is in use, and the nut is tightened to the proper extent, so as to draw the exposed ends of the vias 26 into firm pressure contact with the bumps 46, the fill material 80 prevents collapse of the bumps.

In the modification shown in FIG. 4, the metal sheet 70' is bonded to a flexible sheet 82 of polyimide. The polyimide sheet is then cut to the desired shape, and the metal sheet is selectively etched to define the desired pattern of conductor runs, terminating in contact bumps, on the polyimide sheet. A body 42' of elastomer material is attached to the polyimide sheet on the opposite side from the conductor runs, e.g. by injection molding as described with reference to FIG. 3.

Figure 5:
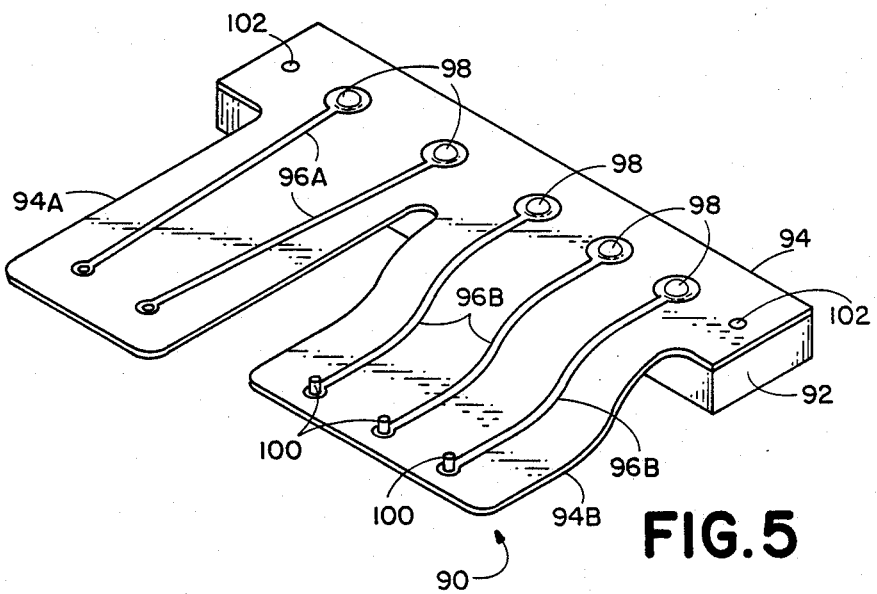
FIG. 5 is a perspective view of a third interconnect device.

The interconnect device 90 shown in FIG. 5 is used to connect contact pads of an attenuator hybrid (not shown) both to conductor runs of a circuit board (not shown) and to contact pads of a preamplifier hybrid (not shown). The interconnect device 90, which is fabricated in similar manner to that described with reference to FIGS. 3 and 4, comprises a body 92 of elastomeric material having a sheet 94 of polyimide bonded thereto. The polyimide sheet is configured with two tongues 94A, 94B extending beyond the body 92. The upper surface of the sheet 94 carries conductor runs 96A, 96B, which extend from over the body 92 along the tongues 94A, 94B respectively. The runs 96 each have a contact bump 98 at the end over the body 92, for engaging vias in the attenuator hybrid. The runs 96B are connected at their opposite ends to conductor runs of the circuit board by pins 100, similar to the pins 60 of FIG. 1, and the runs 96A are connected at their opposite ends to the preamplifier hybrid using pins (not shown). The polyimide sheet 94 and the body 92 are formed with holes 102 to assure proper alignment of the interconnect device relative to the attenuator hybrid and/or the circuit board.

It will be appreciated that the present invention is not restricted to the particular embodiment that has been described and illustrated, and that variations may be made therein without departing from the scope of the invention as defined in the appended claims and equivalents thereof. For example, in order to avoid corrosion and consequent deterioration of the contact quality provided by the contact bumps, the bumps may be provided with a thin coating of gold, e.g. by electroplating. The quantity of gold needed to coat the pre-formed bumps is much less than the quantity needed to form bumps using the conventional plating process.

I claim:

1. A method of forming a contact bump on a sheet of electrically-conductive material, comprising:
    (a) plastically deforming the sheet of electrically-conductive material so as to form a depression on one side of the sheet and a corresponding protrusion on the opposite side thereof,
    (b) placing solid material in the depression, and
    (c) securing the sheet of electrically-conductive material to a support member of elastomeric material.

2. A method according to claim 1, further comprising:
    (d) selectively removing portions of the sheet of electrically-conductive material from the support member of elastomeric material.

3. A method according to claim 2, wherein step (d) comprises removing portions of the sheet of electrically-conductive material by etching.

4. A method of forming a contact bump on a sheet of electrically-conductive material, comprising:
    (a) plastically deforming the sheet of electrically-conductive material so as to form a depression on one side of the sheet and a corresponding protrusion on the opposite side thereof,
    (b) placing solid material in the depression,
    (c) securing the sheet of electrically-conductive material to a sheet-form support member of flexible material, and
    (d) securing the sheet-form support member of flexible material to a body of elastomeric material.

* * * * *